United States Patent
Tan et al.

(10) Patent No.: US 10,931,283 B2
(45) Date of Patent: Feb. 23, 2021

(54) INTEGRATED CIRCUITS HAVING MEMORY WITH FLEXIBLE INPUT-OUTPUT CIRCUITS

(71) Applicant: Intel Corporation, Santa Clara, CA (US)

(72) Inventors: Chang Kian Tan, Bayan Lepas (MY); Chee Hak Teh, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/351,268

(22) Filed: Mar. 12, 2019

(65) Prior Publication Data

US 2019/0214996 A1 Jul. 11, 2019

(51) Int. Cl.
| | |
|---|---|
| H03K 19/17 | (2006.01) |
| H03K 19/17736 | (2020.01) |
| G06F 11/10 | (2006.01) |
| H03K 19/1776 | (2020.01) |
| G11C 11/419 | (2006.01) |
| G11C 11/418 | (2006.01) |
| G11C 29/52 | (2006.01) |
| G11C 7/10 | (2006.01) |
| G11C 8/06 | (2006.01) |
| G11C 29/04 | (2006.01) |

(52) U.S. Cl.
CPC ... *H03K 19/17744* (2013.01); *G06F 11/1048* (2013.01); *G06F 11/1068* (2013.01); *G11C 7/1015* (2013.01); *G11C 11/418* (2013.01); *G11C 11/419* (2013.01); *G11C 29/52* (2013.01); *H03K 19/1776* (2013.01); *G11C 7/106* (2013.01); *G11C 7/1087* (2013.01); *G11C 8/06* (2013.01); *G11C 2029/0411* (2013.01)

(58) Field of Classification Search
CPC ..... G11C 7/1006; G11C 7/1015; G11C 7/106; G11C 7/1087; G11C 11/418; G11C 11/419; G11C 29/52; G11C 2029/0411; G06F 11/1048; H03K 19/17744; H03K 19/1776

See application file for complete search history.

(56) References Cited

U.S. PATENT DOCUMENTS

| | | | |
|---|---|---|---|
| 6,859,065 B2 | 2/2005 | Johnson et al. | |
| 7,475,187 B2 * | 1/2009 | Gregorius | G11C 7/1006 711/104 |

(Continued)

*Primary Examiner* — Vanthu T Nguyen
(74) *Attorney, Agent, or Firm* — Fletcher Yoder, P.C.

(57) ABSTRACT

An integrated circuit may include integrated memory that is formed from a chain of memory blocks. Each memory block may have configurable input and output circuits. The configurable input and output circuits may be interposed between memory circuitry such as a memory array from circuitry external to the memory circuitry. The configurable input and output circuits may have upstream and downstream memory block connection ports. In such a way, configurable input and output circuits in a first memory block may pass control and address signals and data to configurable input and output circuits in a second memory block. By using the configurable input and output circuits, the integrated memory in the integrated circuit may operate to accommodate large bandwidth flows without using the general routing fabric of the integrated circuit.

16 Claims, 10 Drawing Sheets

(56) References Cited

U.S. PATENT DOCUMENTS

| | | | |
|---|---|---|---|
| 7,885,140 B2* | 2/2011 | Gillingham | G11C 7/1078 365/233.1 |
| 8,046,527 B2* | 10/2011 | Pyeon | G06F 13/4243 710/52 |
| 8,407,649 B2 | 3/2013 | Lee et al. | |
| 8,732,646 B2 | 5/2014 | Lee et al. | |
| 9,094,014 B2 | 7/2015 | Lee et al. | |
| 9,563,491 B2* | 2/2017 | Scouller | G06F 11/0727 |
| 10,102,887 B2* | 10/2018 | Ware | G11C 7/1012 |
| 10,120,798 B1 | 11/2018 | Smith et al. | |
| 2009/0043946 A1* | 2/2009 | Webb | G06F 13/4256 711/102 |
| 2019/0129870 A1* | 5/2019 | Atsatt | G06F 13/1605 |

\* cited by examiner

| Configurable Input Control | Configurable Output Control |
|---|---|
| • Multi-Input Write Data, Multiple Write Control | • Single-Output Read Data, Multiple Read Control |
| • Single-Input Write Data, Multiple Write Control | • Multi-Output Read Data, Single Read Control |
| • Multi-Input Write Data, Single Write Control | • Multi-Output Read Data, Multiple Read Control |
| • Single-Input Write Data, Single Write Control | • Single-Output Read Data, Single Read Control |

FIG. 4

INTEGRATED CIRCUITS HAVING MEMORY WITH FLEXIBLE INPUT-OUTPUT CIRCUITS

BACKGROUND

This invention relates generally to integrated circuits and, in particular, to memory in integrated circuits.

Integrated circuits such as programmable logic devices (PLDs) include data storage circuitry such as memory. As applications continue to demand more data and at higher data rates, memory in programmable logic devices needs to increase its data input and output bandwidth capabilities to scale with these applications.

In general, the memory on programmable logic devices may be formed from multiple smaller portions memory circuits that are connected using programmable interconnects within the programmable logic devices. However, using the programmable interconnects in the general routing fabric for high bandwidth routing to and from the memory will strain these portions of the general routing fabric, resulting in high routing congestion and degrading the maximum operating frequency of the programmable logic device.

As such, it is desirable to provide memory in integrated circuits that can accommodate these data-hungry applications and that can reduce routing congestion in the integrated circuits.

It is within this context that the embodiments described herein arise.

BRIEF DESCRIPTION OF THE DRAWINGS

FIG. 4 is a diagram of illustrative input and output controls useable with a chain of memory blocks of the type shown in FIGS. 2 and 3 in accordance with some embodiments.

DETAILED DESCRIPTION

The present embodiments relate to integrated circuits having memory with flexible input and output circuits, and in particular, memory formed from multiple memory blocks each having configurable input and output circuits.

For example, the configurable input circuits for a first memory block may be coupled to the configurable input circuits for a second memory block. Similarly, the configurable output circuits for the first memory block may be coupled to the configurable output circuits for the second memory block. In such a way, the first and second memory blocks (and any additional memory blocks) may operate integrally to form the memory operable with a flexible number of input and output ports. The memory may be operable in multiple read and write modes that include read and write modes to accommodate high bandwidth operations.

It will be recognized by one skilled in the art, that the present exemplary embodiments may be practiced without some or all of these specific details. In other instances, well-known operations have not been described in detail in order not to unnecessarily obscure the present embodiments.

Figure 1:
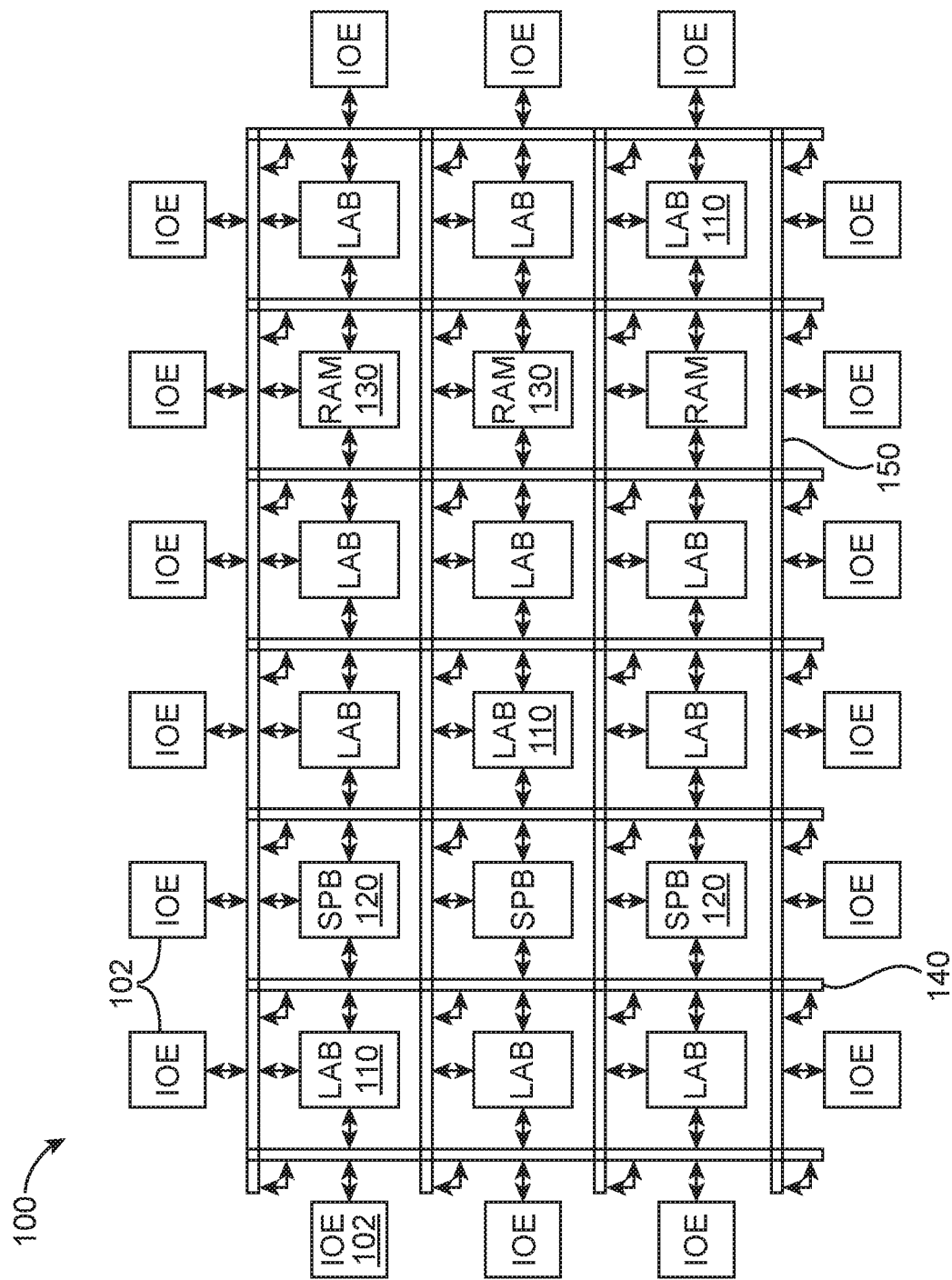
FIG. 1 is a diagram of an illustrative programmable integrated circuit in accordance with some embodiments.

An illustrative embodiment of an integrated circuit such as programmable logic device (PLD) 100 is shown in FIG. 1. As shown in FIG. 1, programmable logic device 100 may include a two-dimensional array of functional blocks, including logic array blocks (LABs) 110 and other functional blocks, such as random access memory (RAM) blocks 130 and specialized processing blocks such as specialized processing blocks (SPB) 120 that are partly or fully hard-wired to perform one or more specific tasks such as mathematical/arithmetic operations. Functional blocks such as LABs 110 may include smaller programmable regions (e.g., logic elements, configurable logic blocks, or adaptive logic modules) that receive input signals and perform custom functions on the input signals to produce output signals. Device 100 may further include programmable routing fabric that is used to interconnect LABs 110 with RAM blocks 130 and specialized processing blocks 120 (sometimes referred to as digital signal processing or DSP blocks). The combination of the programmable logic and routing fabric is sometimes referred to as "soft" logic, whereas the DSP blocks are sometimes referred to as "hard" logic. In general, device 100 may also include other types of hard logic circuitry.

Programmable logic device 100 may contain programmable memory elements for configuring the soft logic. Memory elements may be loaded with configuration data (also called programming data) using input/output elements (IOEs) 102. Once loaded, the memory elements provide corresponding static control signals that control the operation of one or more LABs 110, programmable routing fabric, and optionally SPBs 120 or RAMS 130. In a typical scenario, the outputs of the loaded memory elements are applied to the gates of metal-oxide-semiconductor transistors (e.g., pass transistors) to turn certain transistors on or off and thereby configure the logic in the functional block including the routing paths. Programmable logic circuit elements that may be controlled in this way include parts of multiplexers (e.g., multiplexers used for forming routing paths in interconnect circuits), look-up tables, logic arrays, AND, OR, NAND, and NOR logic gates, pass gates, etc.

The memory elements may use any suitable volatile and/or non-volatile memory structures such as random-access-memory (RAM) cells, fuses, antifuses, programmable read-only-memory memory cells, mask-programmed and laser-programmed structures, mechanical memory devices (e.g., including localized mechanical resonators), mechanically operated RAM (MORAM), programmable metallization cells (PMCs), conductive-bridging RAM (CBRAM), combinations of these structures, etc. Because the memory elements are loaded with configuration data during programming, the memory elements are sometimes referred to as configuration memory, configuration RAM (CRAM), configuration memory elements, or programmable memory elements.

In addition, programmable logic device 100 may have input/output elements (IOEs) 102 for driving signals off of device 100 and for receiving signals from other devices. Input/output elements 102 may include parallel input/output circuitry, serial data transceiver circuitry, differential receiver and transmitter circuitry, or other circuitry used to connect one integrated circuit to another integrated circuit. As shown, input/output elements 102 may be located around the periphery of the chip. If desired, the programmable logic device may have input/output elements 102 arranged in different ways. For example, input/output elements 102 may form one or more columns of input/output elements that may be located anywhere on the programmable logic device (e.g., distributed evenly across the width of the PLD). If desired, input/output elements 102 may form one or more rows of input/output elements (e.g., distributed across the height of the PLD). Alternatively, input/output elements 102 may form islands of input/output elements that may be distributed over the surface of the PLD or clustered in selected areas.

The routing fabric (sometimes referred to as programmable interconnect circuitry) on PLD 100 may be provided in the form of vertical routing channels 140 (i.e., interconnects formed along a vertical axis of PLD 100) and horizontal routing channels 150 (i.e., interconnects formed along a horizontal axis of PLD 100), each routing channel including at least one track to route at least one wire. If desired, routing wires may be shorter than the entire length of the routing channel. A length L wire may span L functional blocks. For example, a length four wire may span four functional blocks. Length four wires in a horizontal routing channel may be referred to as "H4" wires, whereas length four wires in a vertical routing channel may be referred to as "V4" wires.

Furthermore, it should be understood that the present embodiments may be implemented in any integrated circuit. If desired, the functional blocks of such an integrated circuit may be arranged in more levels or layers in which multiple functional blocks are interconnected to form still larger blocks. Other device arrangements may use functional blocks that are not arranged in rows and columns.

In some applications, such as deep learning applications for vision, voice, gesture recognition, memory in an integrated circuit such as PLD 100 may need to handle high data bandwidths in and out of the memory (e.g., receive large amounts of data from external sources, feed large amounts of data to processing cores on the integrated circuit). To properly buffer the large amounts of data, memory may be formed by connecting smaller memory blocks (e.g., RAM 130 in FIG. 2) to each other. However, implementing these connections between smaller memory blocks using the routing fabric in the integrated circuit can cause significant routing congestion. To mitigate these problems, circuit designs would have to include undesirable design limitations that provides suboptimal performance in these data-hungry applications.

Figure 2:
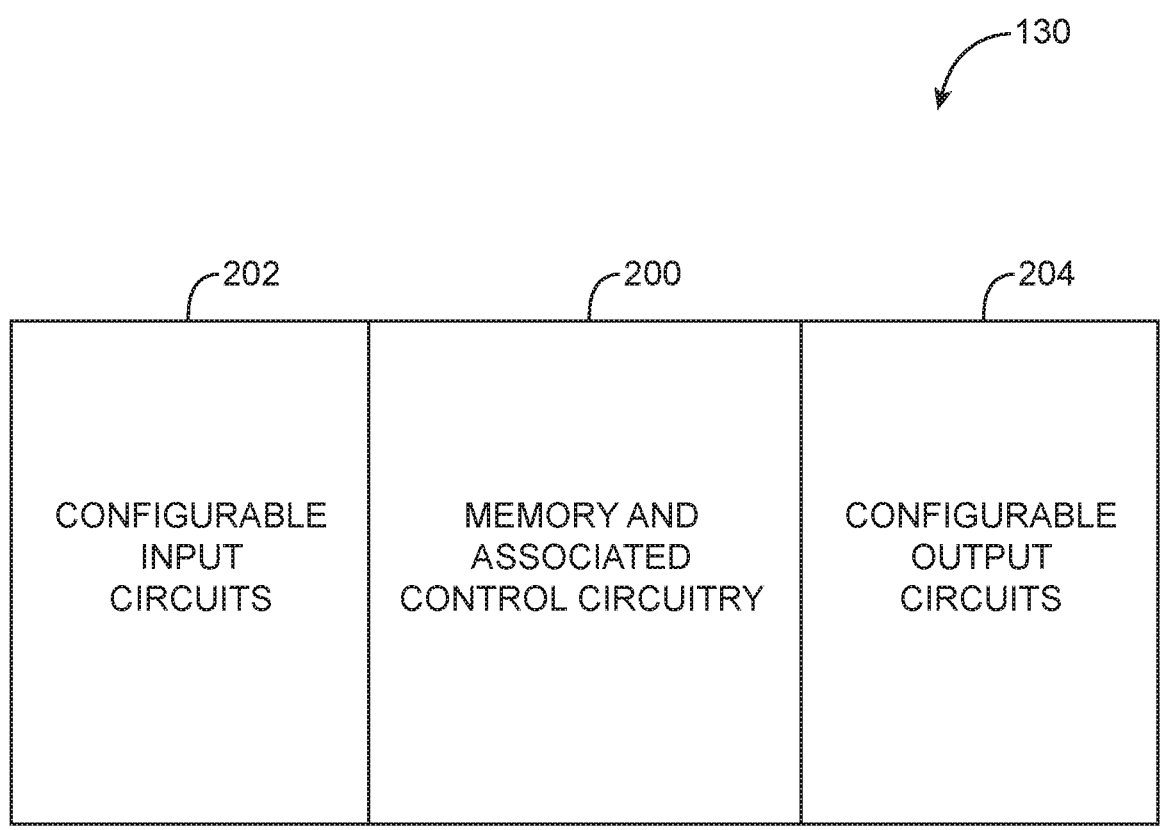
FIG. 2 is a diagram of an illustrative memory block having configurable input and output circuits in accordance with some embodiments.

To more efficiently implement memory in integrated circuits, smaller memory blocks such as RAM 130 in FIG. 2 may include configurable input and output circuits. As shown in FIG. 2, memory block 130 (sometimes referred to as a memory circuit, a memory circuit block or data storage circuitry) may include memory and associated control circuitry 200, configurable input circuits 202 (sometimes referred to as configurable memory inputs), and configurable output circuits 204 (sometimes referred to as configurable memory outputs).

In particular, configurable input circuits 202 may have input and output ports coupled to circuitry 200. Similarly, configurable output circuits 204 may have input and output ports coupled to circuitry 200. In such a way, configurable input and output circuits 202 and 204 may serve as intervening circuits between circuitry 200 and the routing fabric (e.g., programmable interconnections that couple memory block 130 to other functional blocks in the integrated circuit).

As an example, input/output elements 102 in PLD 100 may provide data to be written from an external source to memory block 130 through programmable channels 140 and 150 (in FIG. 1). In order to access memory cells in circuitry 200 in memory block 130, the data may pass through ports and/or circuits in configurable input circuits 202. As another example, processing cores such as a graphics processing unit, a central processing unit, a specialized processing block, etc., may read data from memory block 130 through programmable channels 140 and 150 (in FIG. 1). In order to read data from memory cells in circuitry 200 in memory block 130, the data may pass through ports and/or circuits in configurable output circuits 204. These examples, are merely illustrative. If desired, any functional block, user logic, or circuitry external to memory block 130 may write to and/or read from circuitry 200 by passing signals (e.g., data signals, control signals) through configurable input circuits 202 and receiving signals from configurable output circuits 204.

Figure 3:
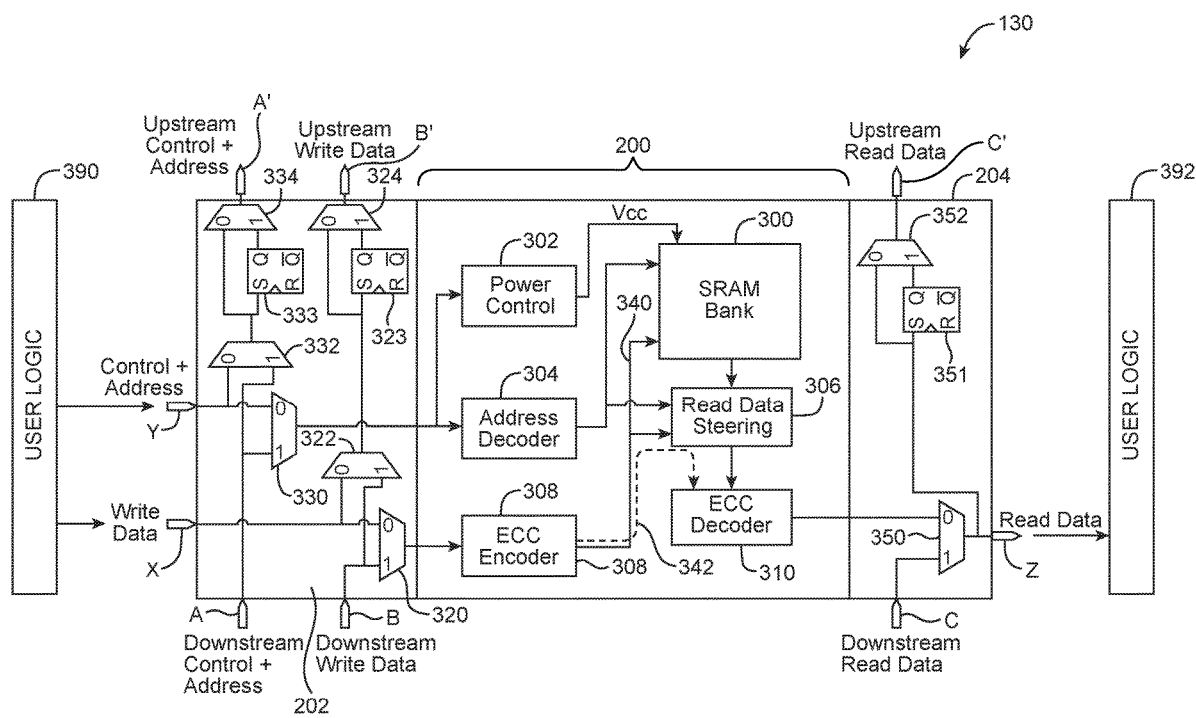
FIG. 3 is a diagram of an illustrative configuration of a memory block of the type shown in FIG. 2 in accordance with some embodiments.

FIG. 3 shows an illustrative implementation for a memory block of the type shown in FIG. 2. As shown in FIG. 3, memory and associated control circuitry 200 may include SRAM bank 300 (sometimes referred to as a SRAM array, a memory cell array, or a memory array) that stores data. Memory and associated control circuitry 200 may include power control circuit 302 that receives, from configurable input circuit 202, a power control signal that determines the operational state of memory circuitry 200 (e.g., whether memory circuitry 200 should be placed in a normal (active) operating mode, in a off (inactive) operating mode, in a standby (sleep) operating mode, or any other operating modes). Power control circuit 302 may be coupled to memory array 300 and provide a power level (e.g., voltage level signal Vcc) corresponding to the operation mode of the received control signal to memory array 300 (or to any other portions of memory and associated control circuitry 200).

Memory and associated control circuitry 200 may include address decoder 304 that receives, from configurable input circuits 202, address signals for reading from and writing into the associated addresses in memory array 300. If desired, address decoder 304 may receive other signals such as enable signals or other operational control signals.

Memory and associated control circuitry 200 may include error-correction code (ECC) encoder 308 that receives write data from configurable input circuits 202. Address decoder 304 and ECC encoder 308 may be coupled to memory array 300 and provide address signals, write data, error correction code data, and other signals to memory array 300 (e.g., to store the write data at corresponding addresses via path 340, to store the error correction code data at corresponding addresses via path 340, etc.).

Memory and associated control circuitry 200 may include read data steering circuit 306 coupled to address decoder 304, ECC encoder 308, and memory array 300. Read data steering circuit 306 may receive data read output from memory circuitry 300 and pass the read data to ECC decoder 310 for ECC checking. The data may be read from an address indicated by a read address signal passed from address decoder 304. ECC decoder circuit 310 may pass the read data to configurable output circuits 204. If desired, memory and associated control circuitry 200 may be configured to perform a simultaneous read and write operation using bypass path 342 (e.g., using the path between ECC encoder circuit 308 and read data steering circuit 306).

Configurable input circuits 202 may have input ports and output ports for accessing circuitry 200 (e.g., writing into memory array 300 or providing addresses to read from memory array 300). The input ports may include one or more write data input ports X and one or more (read and write) address and control input ports Y. Additionally, the input ports may include one or more additional write data input ports B and one or more additional address and control input ports A. Whereas ports X and Y may be coupled directly to user logic 390, ports A and B may be coupled directly to configurable input circuits 202 for other memory blocks of the same type as memory block 130 (or other data storage circuits if desired). Ports B and X may be configured to accommodate write data of any suitable width. Ports A and Y may receive any suitable control and address signals such as a read enable signal, a write enable signal, a power control signal (that is passed to power control circuit 302), an ECC bypass signal (that deactivates the operation of ECC encoder and/or ECC decoder) and an address signal indicative of a read and/or write address of any suitable width.

The output ports of configurable input circuits 202 may include one or more write data output ports A' and one or more address and control output ports B'. Whereas input ports A and B may be coupled to configurable input circuits for a first memory block (of the same type as memory block 130, as an example), output ports A' and B' may be coupled to configurable input circuits for a second memory block (of the same type as memory block 130, as an example). The first memory block may be upstream from memory block 130 (e.g., may provide signals to memory block 130, but not receive signals from memory block 130). The second memory block may be downstream from memory block 130 (e.g., may receive signals from memory block 130, but not provide signals to memory block 130).

Configurable input circuits 202 may also include switching circuits and storage circuits. The switching circuits may include multiplexing circuits such as multiplexers 320, 322, 324, 330, 332, and 334. The multiplexers may each receive a control signal that connects a selected one of two or more inputs of the multiplexer to an output of multiplexer (e.g., passes a signal at a selected one of the first and second inputs as an output signal). The storage circuits may include (pipeline) registers 323 and registers 333. The registers may be S-R latches that receive a clocking signal and a reset signal, as an example.

Multiplexer 320 may have a first input '0' coupled to write data input port X, a second input '1' coupled to write data input port B, and an output coupled to ECC encoder circuit 308. Multiplexer 322 may have a first input '0' coupled to write data input port X, a second input '1' coupled to write data input port B, and an output coupled to multiplexer 324 and register 323. Multiplexer 324 may have a first input '0' coupled directly to multiplexer 322, a second input '1' coupled to multiplexer 322 through register 323, and an output coupled to write data output port B'. The output (Q) of register 323 may be selectively used by multiplexer 324 to pass signals from register 322 in subsequent clocking cycles to meeting timing requirements.

Multiplexer 330 may have a first input '0' coupled to control and address input ports Y, a second input '1' coupled to control and address input ports A, and an output coupled to address decoder circuit 304. Multiplexer 332 may have a first input '0' coupled to control and address input ports Y, a second input '1' coupled to control and address input port A, and an output coupled to multiplexer 334 and register 333. Multiplexer 334 may have a first input '0' coupled directly to multiplexer 332, a second input '1' coupled to multiplexer 332 through register 333, and an output coupled to control and address output port A'. The output (Q) of register 333 may be selectively used by multiplexer 334 to pass signals from register 332 in subsequent clocking cycles to meeting timing requirements.

Configurable output circuits 204 may have input ports and output ports for accessing circuitry 200 (e.g., reading from memory array 300, passing read data from memory array 300 to memory blocks other than memory block 130, or receiving read data from memory blocks other than memory block 130). The output ports of configurable output circuits 204 may include one or more read data output ports Z and one or more read data output ports C'. Read data output ports Z may be coupled directly to user logic 392 or any other circuitry external to memory block 130. The input ports may include one or more read data input ports C. Whereas read data input ports C may be coupled to configurable output circuits for the first (upstream) memory block, read data output ports C' may be coupled to configurable output circuits for the second (downstream) memory block.

Configurable output circuits 204 may also include switching circuits and storage circuits. The switching circuits may include multiplexing circuits such as multiplexers 350 and 352. The multiplexers may each receive a control signal that connects a selected one of two or more inputs of the multiplexer to an output of multiplexer. The storage circuits may include (pipeline) register 351. Register 351 may be a S-R latch, as an example.

Multiplexer 350 may have a first input '0' coupled to ECC decoder circuit 310 (or as other examples, an output of memory array 300 or an output of control circuitry downstream from memory array 300) that supplies read data from array 300, a second input '1' coupled to read data input ports C, and an output coupled to read data output ports Z, and also coupled to multiplexer 352 and register 351. Multiplexer 352 may have a first input '0' coupled directly to multiplexer 350, a second input '1' coupled to multiplexer 350 through register 351, and an output coupled to read data output ports C'. The output (Q) of register 351 may be selectively used by multiplexer 352 to pass signals from register 350 in subsequent clocking cycles to meeting timing requirements.

In the exemplary configuration of FIG. 3, configurable input circuits 202 may be interposed between circuitry external to memory block 130 (more specifically, circuitry external to a plurality of memory blocks 130 connected to form an integrated memory) and circuitry 200. Configurable output circuits 204 may be interposed between the external circuitry and circuitry 200. By providing external ports to memory block 130 at configurable circuits, these configurable circuits may configure a chain of memory blocks 130 (e.g., a plurality of memory blocks that are concatenated or that are coupled in series) to form efficient memory having multiple input and output modes.

The configuration of FIG. 3 is merely illustrative. If desired, configurable input and output circuits 202 and 204 may be implemented in any desirable manner. As an example, multiplexers 320 and 322 may be merged (since they receive the same inputs). As another example, while FIG. 3 shows only two upstream-to-downstream paths in configurable input circuits 202 respectively connecting ports A to A' and B to B', other parallel paths may also be added. This may accommodate write data and control and address signals that have a non-singular width (e.g., a bit width of 2, 4, 8, 16, etc.). If desired, other paths may be added to pass other signals from configurable input circuits in one memory block to those of another memory block. Configurable output circuits 204 may similarly be modified (e.g., may include additional paths that accommodate the width of the read data or that pass other signals). If desired, sequential elements such as registers may be added or removed (e.g., activated or deactivated) as needed to comply with timing requirements.

FIG. 4 is a diagram showing illustrative operating controls for operating memory in different modes of operation. As an example, the memory may be formed form multiple sets of memory block 130 in FIG. 3 coupled in a chain. Since separate memory blocks 130 are implemented with configurable input circuits separate from configurable output circuits, different combinations of configurations for input and output controls may be implemented.

Configurable input control may be provided by controlling respective configurable inputs circuits 202 for a plurality of memory blocks that implement an integrated memory. As an example, processing and/or control circuitry for controlling the integrated memory may provide configurable input control signals to configurable input circuits 202 (e.g., to switching and storage circuits in configurable input circuits 202, to multiplexer control inputs, or to port control inputs).

As a first mode of memory input operation, the control circuitry may configure configurable input circuits 202 to receive multiple sets of (different) write data at multiple memory blocks 130 ("multi-input write data" in FIG. 4) and to receive multiple sets of (different) write control and address signals at multiple memory blocks 130 ("multiple write control" in FIG. 4). The multiple sets of write data may be separately written into respective memory arrays in the multiple memory blocks using the multiple sets of write control and address signals. As an example, each memory block 130 (e.g., configurable input circuits 202 in each memory block 130) may be configured to receive different write data (at respective ports X) and corresponding write control and address signals (at respective ports Y) to write the write data into the corresponding memory array 300. When operated in this manner, each memory block may operate separately from each other (e.g., as if there were no upstream or downstream memory blocks from any memory block).

As a second mode of memory input operation, the control circuitry may configure configurable input circuits 202 to receive a single set of write data at a single memory block 130 ("single-input write data" in FIG. 4) and to receive multiple sets of (different) write control and address signals at multiple memory blocks 130 ("multiple write control" in FIG. 4). The single set of write data may be written into one or more of the multiple memory blocks 130 using the multiple sets of write control and address signals. As an example, a given memory block that receives the single set of write data may pass the write data to memory blocks downstream from the given memory block using ports B' in configurable input circuits 202 in the given memory block. When operated in this manner, each memory block (except the given memory block) may receive the single set of write data using respective ports B' in the previous memory block. Each memory block may receive separate and different sets of write control and address signals (at respective ports Y) to store the single set of write data in any suitable manner in the corresponding memory array 300 (e.g., at different addresses across each memory array 300).

As a third mode of memory input operation, the control circuitry may configure configurable input circuits 202 to receive multiple sets of write data at multiple memory blocks 130 ("multi-input write data" in FIG. 4) and to receive a single set of write control and address signals at a single memory block 130 ("single write control" in FIG. 4). The multiple sets of write data may be written into the multiple memory blocks 130 using the single set of write control and address signals. As an example, a given memory block that receives the single set of write control and address signals may pass the single set of write control and address signals to memory blocks downstream from the given memory block using ports A' in configurable input circuits 202 in the given memory block. When operated in this manner, each memory block (except the given memory block) may receive the single set of write control and address signals at ports A in the current memory block from respective ports A' in the previous memory block. Each memory block may receive separate sets of write data (at respective ports X) and use the same set of write control and address signals to store each set of write data in any suitable manner in the corresponding memory array 300.

If desired, the control circuitry may configure configurable input circuits 202 to receive a single set of write data at a single memory blocks 130 ("single-input write data" in FIG. 4) and to receive a single set of write control and address signals at a single memory block 130 ("single write control" in FIG. 4). This may be an additional mode of memory input operation. When operated in this manner, each memory block (except the memory block that receives the write data and the write control and address signals) may receive the same set of write data and control and address signals from respective ports A and B from ports A' and B' from preceding memory block.

Configurable output control may be provided by controlling respective configurable output circuits 204 for a plurality of memory blocks that implement an integrated memory. As an example, processing and/or control circuitry for controlling the integrated memory may provide configurable output control signals to configurable output circuits 204 (e.g., to switching and storage circuits in configurable output circuits 204, to multiplexer control inputs, or to port control inputs).

As a first mode of memory output operation, the control circuitry may configure configurable output circuits 204 to pass a single set of read data from read data output ports Z in a single memory block 130 ("single-output read data" in FIG. 4) and to receive multiple sets of (different) read control and address signals at multiple memory blocks 130 ("multiple read control" in FIG. 4). Read data output ports Z at the single memory block 130 may output data read out from multiple memory blocks 130 using the multiple sets of different read control and address signals received at the multiple memory blocks 130. As an example, a given downstream memory block 130 may be configured to receive read data from its own memory array 300 and from memory arrays from upstream memory blocks using configurable output circuits 204 (through ports C and C' in the memory blocks). When operated in this manner, the given memory block may operate to pass read data from not only its own memory array 300 but from any other memory array 300 in any upstream memory blocks 130.

As a second mode of memory output operation, the control circuitry may configure configurable output circuits 204 to pass multiple sets of (different) read data at respective read data output ports Z from multiple memory blocks 130 ("multi-output read data" in FIG. 4) and to receive a single set of read control and address signals at a single memory block 130 ("single read control" in FIG. 4). The read data output ports Z of each of the multiple memory blocks 130 may output data read out from its own memory array 300 using the single set of read control and address signals shared between the multiple memory blocks 130. As an example, a given memory block that receives the single set of read control and address signals may pass the read control and address signals to memory blocks downstream from the given memory block using ports A' in configurable input circuits 202 in the given memory block. If desired, these circuits for read control and address signals may be implemented as a part of configurable output circuits 204. When operated in this manner, each memory block (except the given memory block) may receive the same set of read control and address signals using respective ports A' in the previous memory block.

If desired, the control circuitry may configure configurable output circuits 204 to operate in additional modes. As an example, the additional modes may include a "multi-output read data and multiple read control" mode, where multiple read data output ports Z in each memory block pass read data from its own memory array using a separate set of read control and address signals. This is similar to operating each memory block separately from one another (e.g., without upstream and downstream connections). As another example, the additional modes may include a "single-output read data and a single read control" mode, where a single read data output port Z in a single (most downstream) memory block passes read data from one or more memory arrays in the memory block chain using a single set of read control and address signals passed along the memory block chain using ports A and A' in configurable input circuits 202. The single set of read control and address signals may be initially received at another (most upstream) memory block. If desired, these ports A and A' for passing read control and address signals may be implemented in configurable output circuits 204 instead.

As the integrated memory may implement read and write operations separately and memory block 130 includes configurable input circuits 202 separate from configurable output circuits 204, any desirable combination of one of the input controls (left column of FIG. 4) and one of the output controls (right column of FIG. 4) may be used to operate the integrated memory. The controls of FIG. 4 are merely illustrative. If desired, one or more modes may be omitted and one or more modes may be added.

Figure 5:
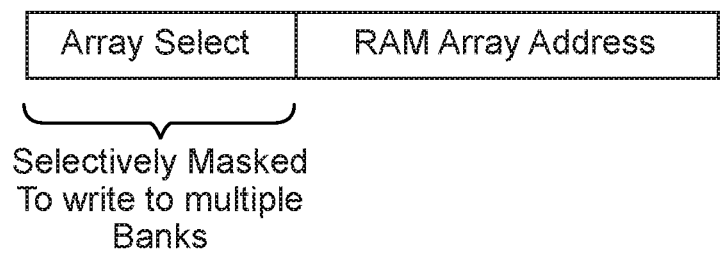
FIG. 5 is a diagram of an illustrative masking scheme useable with a chain of memory blocks of the type shown in FIGS. 2 and 3 in accordance with some embodiments.

In some operating modes where a single set of control and address signals may be used to selectively control multiple memory arrays (e.g., a single address signal may be used to address multiple memory arrays), it may be desirable to implement a masking feature in circuitry 200 in memory block 130 (FIG. 3). As shown in FIG. 5, an address signal may include an array select portion and a memory array address portion. The array select portion may be selectively masked to write to multiple memory arrays 300 in multiple memory blocks 130 with the same address signal.

As an example, the masking feature in FIG. 5 may be implemented in address decoder circuit 304 in FIG. 3. When it is desirable to write to (or similarly read from) a given memory array without writing to any other arrays using an address signal, address decoder circuit 304 may process the entirety of the address signal (e.g., including the array select portion). As such, only the corresponding memory array is accessed. However, when it is desirable to write to (or similarly read from) multiple memory arrays simultaneously using a single address signal, respective address decoder circuits 304 in multiple memory arrays may process only the memory array address portion of the address signal (e.g., without processing the array selection), thereby performing a masking operation for the array select portion. When the array selection portion is masked, the general memory array address is applicable to multiple memory arrays (e.g., all memory arrays), and the multiple memory arrays may be accessed. As an example, address decoder circuit 304 may receive an input control signal that controls decoder circuit 304 to perform the masking operation as desired.

Figure 6:
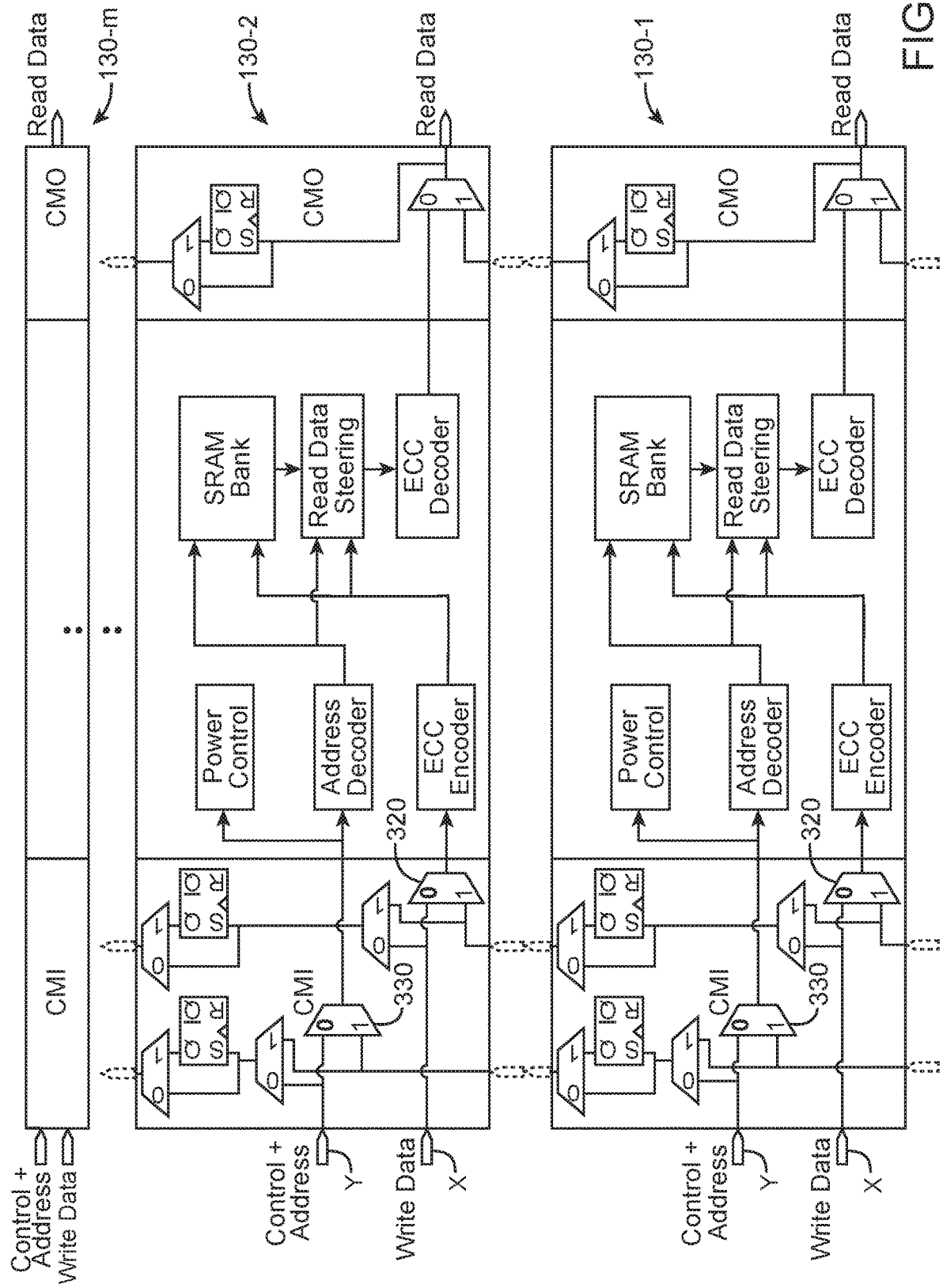
FIG. 6 is a diagram of illustrative memory configured to process multiple data inputs with multiple sets of write control inputs in accordance with some embodiments.

FIGS. 6-10 shows illustrative memory formed from a plurality of memory blocks 130 when operating according to some illustrative control configurations as described in connection with FIG. 4. FIG. 6 shows illustrative memory having memory blocks 130-1, 130-2, . . . , 130-m coupled to each other in a chain. The memory may be configured to operate in a multi-input write data and multiple write control mode. In particular, each of memory blocks 130-1, 130-2, . . . , 130-m may receive write data at ports X and write control and address signals at ports Y. Control circuitry may select the inputs '0' of registers 320 and 330 in each of memory blocks 130-1, 130-2, . . . , 130-m and use the corresponding signals received at each of ports X and Y to access the corresponding memory array in each of memory blocks 130-1, 130-2, . . . , 130-m. All of ports A, A', B, B' for passing data and signals to upstream and downstream memory blocks may be deactivated.

Figure 7:
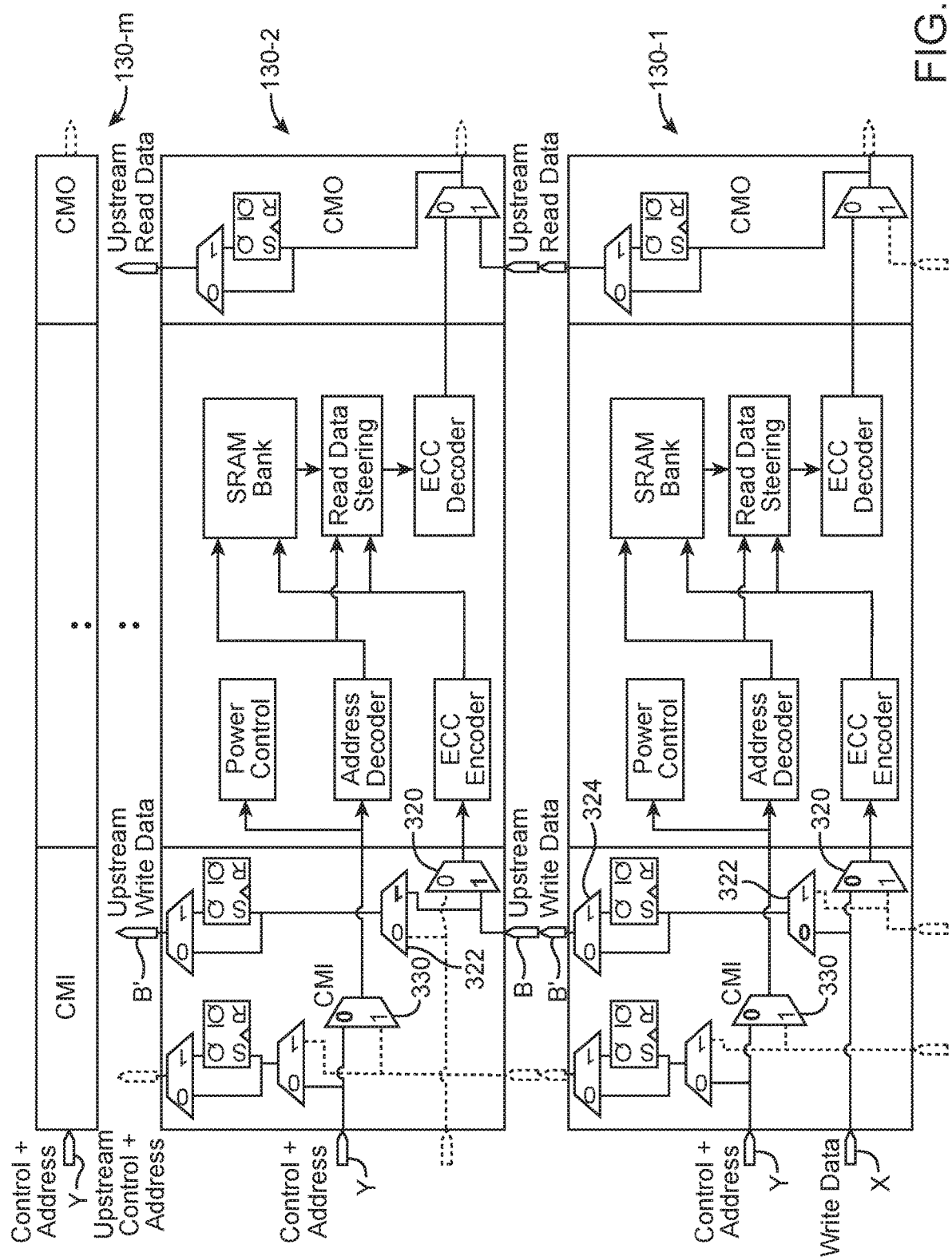
FIG. 7 is a diagram of illustrative memory configured to process a single data input with multiple sets of write control inputs in accordance with some embodiments.

FIG. 7 shows illustrative memory having memory blocks 130-1, 130-2, . . . , 130-m coupled to each other. The memory may operate in a single-input write data and multiple write control mode. In particular, only memory block 130-1 (e.g., the most upstream memory block) may receive write data at write data input ports X (e.g., no other memory blocks 130 receive write data at their write data input ports X). Memory block 130-1 may operate in a similar manner as described in connection with FIG. 6 (e.g., performing data write at memory block 130 using data received at ports X and signals received at ports Y). Control circuitry may additionally control multiplexers 322 and 324 to pass the write data received at its write data input port X to downstream memory block 130-2 using write data output ports B'.

Downstream memory block 130-2 may receive the write data at its write data input port B and use the write data in conjunction with its own write control and address signals received at its control and address ports Y to write the write data into memory array 300 in memory block 130-2. In particular, control circuitry may control multiplexers 320 and 322 to pass input '1' as outputs and control multiplexer 330 to pass input '0' and an output. Memory block 130-2 may similarly pass the write data through its write data output ports B' to memory blocks further downstream. These further downstream memory blocks may use the passed write data in conjunction with their own write control and address signals to write the data into their own memory array (similar to the operations described for memory block 130-2). This process may propagate until the write data reaches the mth memory block 130-m (e.g., the most downstream memory array), and memory block 130-m also processes the write data with its own write control and address signals, but does not pass the write data further downstream.

Figure 8:
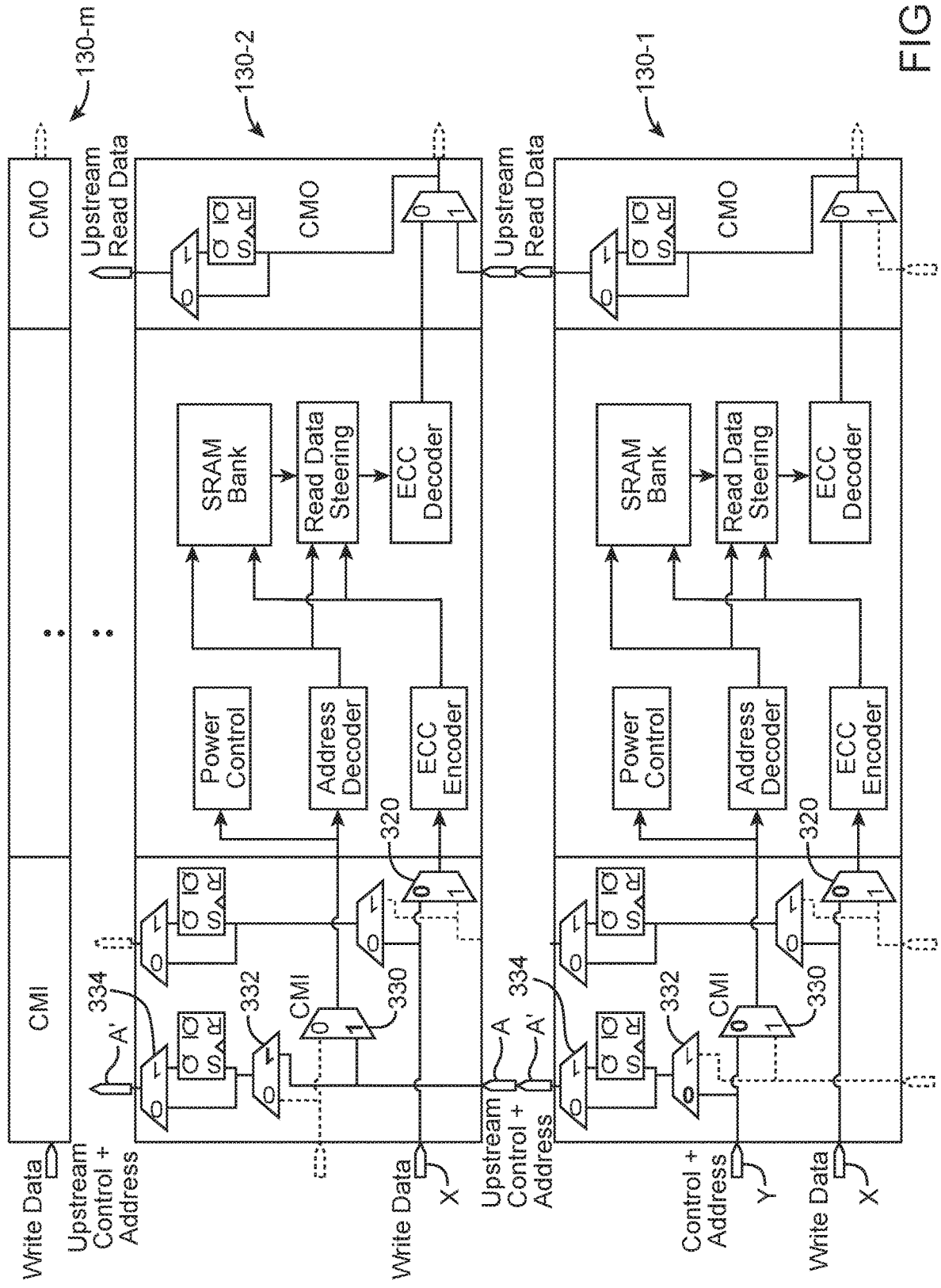
FIG. 8 is a diagram of illustrative memory configured to process multiple data inputs with a single set of write control inputs in accordance with some embodiments.

FIG. 8 shows illustrative memory having memory blocks 130-1, 130-2, . . . , 130-*m* coupled to each other. The memory may operate in a multiple-input write data and single write control mode. In particular, only memory block 130-1 (e.g., the most upstream memory block) may receive a set of write control and address signals at control and address ports Y (e.g., no other memory blocks 130 receive write control and address signals at their control and address ports Y). Memory block 130-1 may operate in a similar manner as described in connection with FIG. 6 (e.g., performing data write at memory block 130 using write data received at ports X and write control and address signals received at ports Y). Control circuitry may additionally control multiplexers 332 and 334 to pass the set of write control and address signals received at its control and address input ports Y to downstream memory block 130-2 using control and address output ports A'. As an example, control circuitry may control multiplexers 330 and 332 to pass input '0' as outputs and control multiplexer 320 to pass input '0' and an output.

Downstream memory block 130-2 may receive the set of write control and address signals at its control and address input ports A and use the set of write control and address signals in conjunction with its own write data received at its write data input ports X to write its own write data into the memory array in memory block 130-2 using the shared write control and address signals. Memory block 130-2 may similarly pass the write control and address signals through its ports A' to memory blocks further downstream. These further downstream memory blocks may use the passed write control and address signals in conjunction with their own write data to write their own write data into their own memory array (similar to the operations described for memory block 130-2). This process may propagate until the write control and address signals reaches the mth memory block 130-*m* (e.g., the most downstream memory array), and memory block 130-*m* also processes its own write data with the passed write control and address signals, but does not pass the write control and address signals further downstream.

Figure 9:
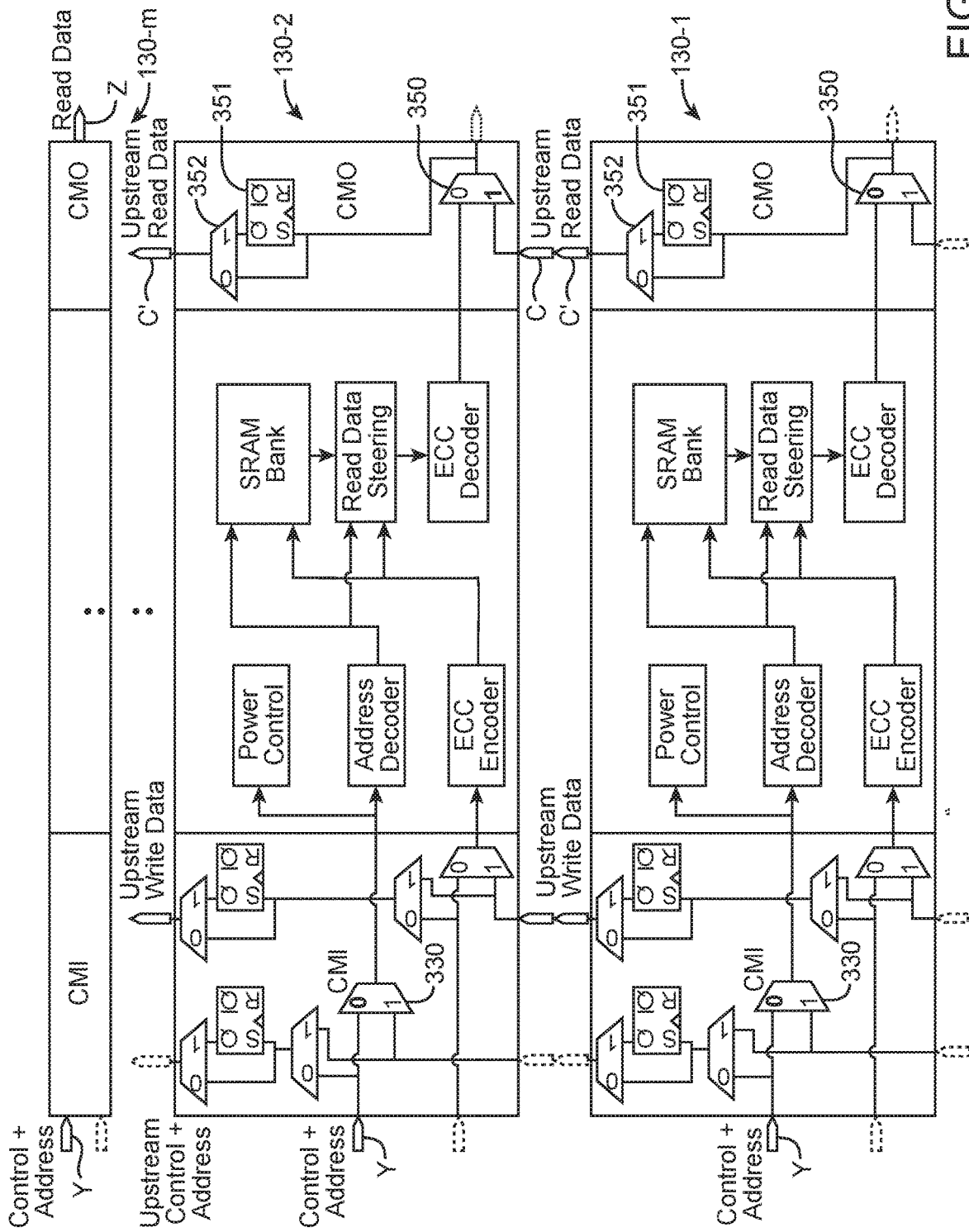
FIG. 9 is a diagram of illustrative memory configured to process a single data output with multiple sets of read control inputs in accordance with some embodiments.

FIG. 9 shows illustrative memory having memory blocks 130-1, 130-2, . . . , 130-*m* coupled to each other. The memory may operate in a single-output read data and multiple read control mode. In particular, only memory block 130-*m* (e.g., the most downstream memory block) may output read data at its read data output ports Z (e.g., no other memory blocks 130 output read data at their read data output ports Z). Read data output ports Z in memory block 130-*m* may output read data from its memory array 300 in memory block 130-*m* using read control and address signals received at its own control and address ports Y in memory block 130-*m*. Additionally, read data output ports Z in memory block 130-*m* may output read data from other memory arrays 300 in other memory blocks such as memory block 130-(*m* −1), . . . , memory block 130-2, and memory block 130-1.

In particular, control circuitry may configure multiplexer 350 and 352 in each upstream memory block (besides the most upstream memory block) to pass read data obtained from its own memory array 300 to downstream memory blocks (using respective ports C and C' in the upstream memory blocks). As an example, control circuitry may control multiplexers 350 in each upstream memory block (e.g., memory block 130-2) to pass input '1' as an output. The read data obtained from memory array 300 in the upstream memory blocks may be obtained using respective read control and address signals received at separate respective control and address input ports Y in the upstream memory blocks. The passed upstream read data may also be output by read data output ports Z in memory block 130-*m* (e.g., in a sequential manner as enabled by multiplexers 352 and registers 351 in each memory block).

Figure 10:
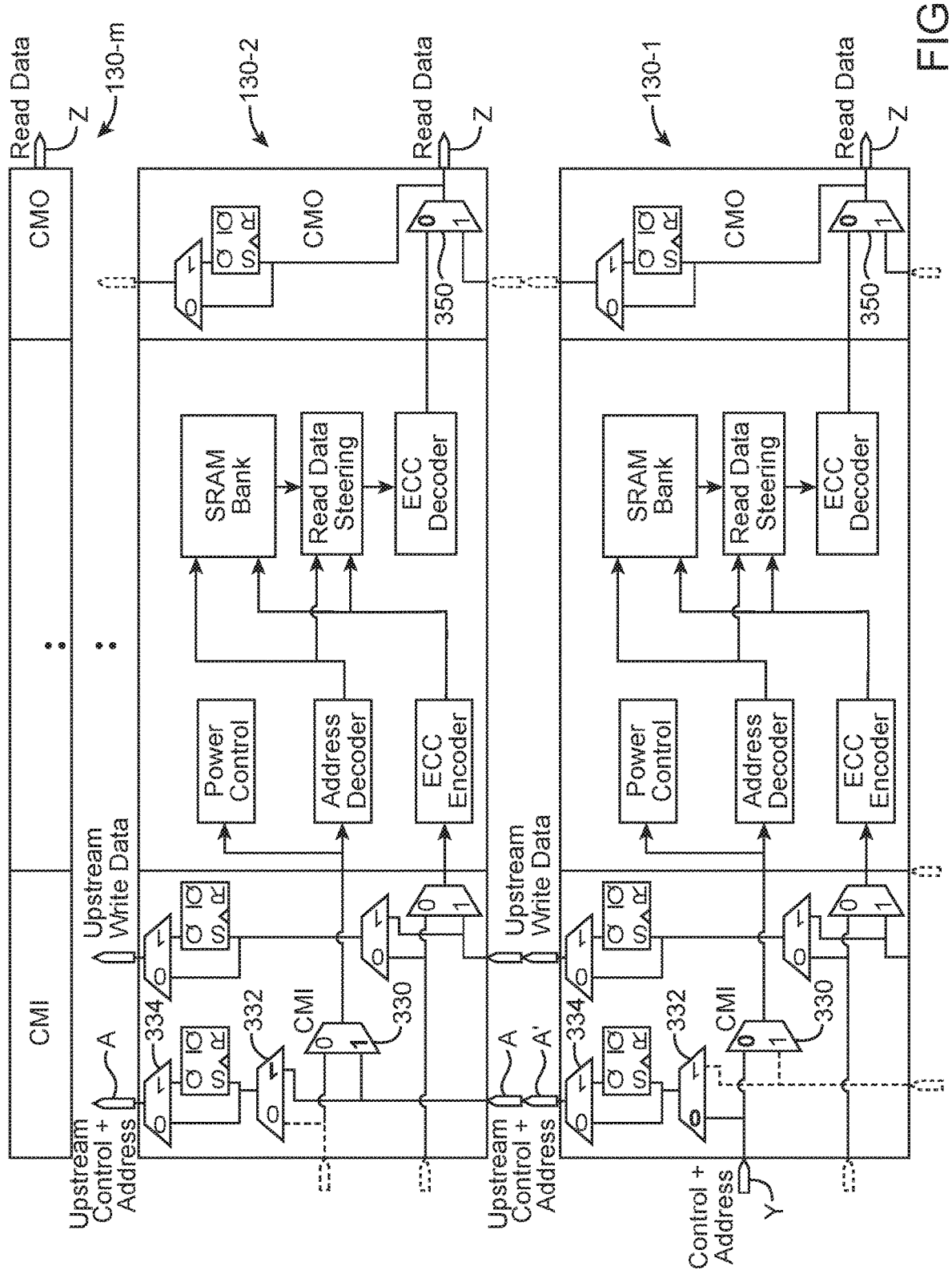
FIG. 10 is a diagram of illustrative memory configured to process multiple data output with a single set of read control inputs in accordance with some embodiments.

FIG. 10 shows illustrative memory having memory blocks 130-1, 130-2, . . . , 130-*m* coupled to each other. The memory may operate in a multiple-output read data and single read control mode. In particular, only memory block 130-1 (e.g., the most upstream memory block) may receive a set of read control and address signals at its control and address ports Y (e.g., no other memory blocks 130 receive read control and address signals at their control and address ports Y). Memory block 130-1 may use the read control and address signals received at its control and address ports Y to pass the corresponding read data in memory array 300 in memory block 130-1 to read data output ports Z in memory block 130-1. In other words, control circuitry may control multiplexer 330 to pass input '0' as an output to control memory array 300 in memory block 130-1.

Control circuitry may additionally control multiplexers 332 and 334 to pass the set of read control and address signals received at its control and address ports Y to downstream memory block 130-2 using control and address output ports A'. Downstream memory block 130-2 may receive the set of read control and address signals at control and address input port A and use the set of read control and address signals to read out read data from the memory array in memory block 130-2. In particular, control circuitry may control multiplexers 330 and 332 to pass input '1' as outputs in memory block 130-2. Memory block 130-2 may similarly pass the read control and address signals through its ports A' to memory blocks further downstream. These further downstream memory blocks may use the passed read control and address signals to read out read data from their own memory array (similar to the operations described for memory block 130-2). This process may propagate until the read control and address signals reaches the mth memory block 130-*m* (e.g., the most downstream memory array), and memory block 130-*m* also processes the passed read control and address signals to read out from its own memory array 300, but does not pass the read control and address signals further downstream.

The registers (e.g., registers 323, 333, and 351) in each memory block may be selectively bypassed or used as necessary to accommodate timing requirements and/or to provide pass sequential write and/or read data. If desired, some registers may be omitted or deactivated from one or more of the memory blocks.

The examples in FIGS. 6-10 are merely illustrative. If desired, any combination of input and output controls may be implemented in memory having memory blocks 130-1, 130-2, . . . , 130-*m*. If desired, any suitable number of memory blocks may be coupled to each other (e.g., a three memory block chain, a four memory block chain, a five memory block chain, a ten memory block chain, a more than three memory block chain, etc.). Memory circuitry implemented by the chain of memory blocks may switch between each of the configurations as described in connection with FIGS. 6-10 or any other configurations (e.g., configurations mentioned in connection with FIG. 4). Control circuitry may control the memory blocks to switch between the different configurations by enabling and/or disabling ports, by controlling switching circuitry, by controlling sequential circuitry, by providing different power controls to the memory blocks, etc. Additionally, while one or more control and address signals may be passed downstream, some control and address signals may be not passed downstream, if desired.

By providing memory having a chain of memory blocks, each having configurable input and output circuits, different input and output controls may be implemented as necessary to specific applications. As examples, the memory may receive and process large amounts of parallel or sequential write data from a source circuit, may output and feed large amounts of parallel or sequential read data to processing circuitry, may operate each memory block separately (e.g., selectively disabling one or more memory blocks using a power control circuit), may operate in any combination of these modes.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs), microcontrollers, microprocessors, central processing units (CPUs), graphics processing units (GPUs), etc. Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

EXAMPLES

The following examples pertain to further embodiments.

Example 1 is an integrated circuit, comprising: a memory block that comprises: an array of memory cells; and configurable memory input circuits coupled to the array of memory cells, wherein the configurable memory input circuits include a write data input port, a write data output port, switching circuits operable to pass write data from the write data input port to the write data output port, and wherein the write data input port uses the switching circuits to access the array of memory cells.

Example 2 is the integrated circuit of example 1, wherein the configurable memory input circuits further include a control input port, and a control output port, wherein the switching circuits are further operable to pass control signals from the control input port to the control output port, and wherein the control input port uses the switching circuits to access the array of memory cells.

Example 3 is the integrated circuit of any one of examples 1-2, wherein the configurable memory input circuits further include an additional write data input port.

Example 4 is the integrated circuit of example 3, wherein the switching circuits comprise a first multiplexing circuit having a first input coupled to the write input data port, a second input coupled to the additional write input data port, and an output coupled to the array of memory cells.

Example 5 is the integrated circuit of example 4, wherein the switching circuits further comprise a second multiplexing circuit having a first input coupled to the write input data port, a second input coupled to the additional write input data port, and an output coupled to the write output data port.

Example 6 is the integrated circuit of example 2, wherein the configurable memory input circuits further include an additional control input port.

Example 7 is the integrated circuit of example 6, wherein the switching circuits comprise a first multiplexing circuit having a first input coupled to the control input port, a second input coupled to the additional control input port, and an output coupled to the array of memory cells.

Example 8 is the integrated circuit of example 7, wherein the switching circuits further comprise a second multiplexing circuit having a first input coupled to the control input port, a second input coupled to the additional control input port, and an output coupled to the control output port.

Example 9 is the integrated circuit of any one of examples 1-8, wherein the configurable memory input circuits further include a register coupled between the write data input port and the write data output port.

Example 10 is the integrated circuit of any one of examples 2-9, wherein the memory block further comprises: a power control circuit configured to manage the power usage of the array of memory cells; an address decoder coupled between the control input port and the array of memory cells; and an error correction encoder coupled between the write data input port and the array of memory cells.

Example 11 is the integrated circuit of any one of examples 1-10, wherein the memory block further comprises configurable memory output circuits coupled to the array of memory cells, wherein the configurable memory output circuits have a first read data port, a second read data port, and additional switching circuits configurable to pass read data from the array of memory cells to first and second read data ports.

Example 12 is an integrated circuit, comprising: a memory block that comprises: an array of memory cells; and configurable memory output circuits coupled to the array of memory cells, wherein the configurable memory output circuits include a first read data output port, a second read data output port, and switching circuits operable to pass read data from the array of memory cells to at least one of the first and second read data output ports.

Example 13 is the integrated circuit of example 12, wherein the switching circuits are further operable to pass the read data from the array of memory cells to both of the first and second read data output ports.

Example 14 is the integrated circuit of any one of examples 12-13, wherein the configurable memory output circuits further includes a read data input port, and wherein the switching circuits are further operable to connect the read data input port to at least one of the first and second read data output ports.

Example 15 is the integrated circuit of example 14, wherein the switching circuits comprise a multiplexing circuit having a first input coupled to the array of memory cells, a second input coupled to the read data input port, and an output coupled to the first and second read data output ports.

Example 16 is an integrated circuit, comprising: a chain of memory blocks, wherein: each memory block in the chain of memory blocks includes a memory array; the chain of memory blocks comprises at least a first memory block and a second memory block; the first memory block in the chain of memory blocks includes a write data input port; and write data on the write data input port of the first memory block is fed to the memory array of the second memory block.

Example 17 is the integrated circuit of example 16, wherein the write data on the write data input port of the first memory block is also fed to the memory array of the first memory block.

Example 18 is the integrated circuit of any one of examples 16-17, wherein the first memory block in the chain of memory blocks includes a control input port, and wherein control signals on the control input port of the first memory block is fed to the memory array of at least one of the first and second memory blocks.

Example 19 is the integrated circuit of any one of examples 16-18, wherein the second memory block further includes an additional write data input port, an additional control input port, and a switching circuit having a first input coupled to the additional write data input port of the second memory block, a second input coupled to the write data input port of the first memory block, and an output port that is coupled to the memory array of the second memory block.

Example 20 is the integrated circuit of any one of examples 16-19, wherein the first memory block in the chain of memory blocks includes a first read data output port, wherein the second memory block in the chain of memory blocks includes a second read data output port, and wherein read data from the memory array of the first memory block is output onto at least one of the first and second read data output ports.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

For instance, all optional features of the apparatus described above may also be implemented with respect to the method or process described herein. The foregoing is merely illustrative of the principles of this disclosure and various modifications can be made by those skilled in the art. The foregoing embodiments may be implemented individually or in any combination.

What is claimed is:

1. An integrated circuit, comprising:
 a chain of memory blocks, wherein each of the memory blocks in the chain comprises:
  an array of memory cells; and
  configurable memory input circuits coupled to the array of memory cells, wherein the configurable memory input circuits include a write data input port, a write data output port, a control input port, a control output port, and multiplexing circuits operable to pass write data from the write data input port to the write data output port and operable to pass control signals from the control input port to the control output port, and wherein the chain of memory blocks is operable in a single input write data and multi-write control mode; and
 a custom logic circuit formed within the integrated circuit, wherein the custom logic circuit is configured to provide the write data to the write data input port of the memory block.

2. The integrated circuit of claim 1, wherein the configurable memory input circuits in each of the memory blocks further include an additional write data input port.

3. The integrated circuit of claim 2, wherein the multiplexing circuits in each of the memory blocks comprise a first multiplexing circuit having a first input coupled to the write input data port, a second input coupled to the additional write input data port, and an output coupled to the array of memory cells.

4. The integrated circuit of claim 3, wherein the multiplexing circuits in each of the memory blocks further comprise a second multiplexing circuit having a first input coupled to the write input data port, a second input coupled to the additional write input data port, and an output coupled to the write output data port.

5. The integrated circuit of claim 1, wherein the configurable memory input circuits in each of the memory blocks further include an additional control input port.

6. The integrated circuit of claim 5, wherein the multiplexing circuits in each of the memory blocks comprise a first multiplexing circuit having a first input coupled to the control input port, a second input coupled to the additional control input port, and an output coupled to the array of memory cells.

7. The integrated circuit of claim 6, wherein the multiplexing circuits in each of the memory blocks further comprise a second multiplexing circuit having a first input coupled to the control input port, a second input coupled to the additional control input port, and an output coupled to the control output port.

8. The integrated circuit of claim 1, wherein the configurable memory input circuits in each of the memory blocks further include a register coupled between the write data input port and the write data output port.

9. The integrated circuit of claim 1, wherein each of the memory blocks further comprises:
 a power control circuit configured to manage the power usage of the array of memory cells;
 an address decoder coupled between the control input port and the array of memory cells; and
 an error correction encoder coupled between the write data input port and the array of memory cells.

10. The integrated circuit of claim 1, wherein each of the memory blocks further comprises configurable memory output circuits coupled to the array of memory cells, wherein the configurable memory output circuits have a first read data port, a second read data port, and additional multiplexing circuits configurable to pass read data from the array of memory cells to first and second read data ports.

11. An integrated circuit, comprising:
 a chain of memory blocks, wherein each of the memory blocks in the chain comprises:
  an array of memory cells;
  configurable memory input circuits coupled to the array of memory cells, wherein the configurable memory input circuits first and second write data input ports and first and second control input ports; and configurable memory output circuits coupled to the array of memory cells, wherein the configurable memory output circuits include a first read data output port connected to another memory block in the chain, a second read data output port connected to user logic that is external to the memory block but within the integrated circuit, and wherein the chain of memory blocks is operable in a single output read data and multi-read control mode during which the configurable memory input circuits are configured to provide a separate control signal to each of the memory blocks while the configurable memory output circuits are configured to pass a single read data down the chain of memory blocks.

12. The integrated circuit of claim 11, wherein the chain of memory blocks is further operable in a multi-output read data and single read control mode during which the configurable memory input circuits are configured to pass a control signal down the chain of memory blocks while the configurable memory output circuits are configured to output multiple read data from the memory blocks in parallel.

13. An integrated circuit, comprising:
a chain of memory blocks, wherein:
each of the memory blocks in the chain comprises a memory array and configurable memory input circuits having first and second write data input ports and first and second control input ports;
the chain of memory blocks comprises at least a first memory block and a second memory block; and
the chain of memory blocks is operable in a multi-input write data and single write control mode during which each of the first and second memory blocks passes write data from its first write data input port to a corresponding memory array while a control signal is conveyed from the first memory block to the second memory block.

14. The integrated circuit of claim 13, wherein the chain of memory blocks is further operable in a single input write data and multi-write control mode during which the first memory block conveys write data to the second memory block while each of the first and second memory blocks passes a control signal from its first control input port to a corresponding memory array.

15. The integrated circuit of claim 11, wherein the user logic comprises customizable user logic.

16. The integrated circuit of claim 11, wherein the user logic comprises programmable logic circuitry.

* * * * *